US006474480B2

(12) United States Patent
Negishi

(10) Patent No.: US 6,474,480 B2
(45) Date of Patent: Nov. 5, 2002

(54) MECHANISM FOR REDUCING VIBRATORY MOTION APPLIED TO A RACK-MOUNTED CARD CAGE

(75) Inventor: Masayuki Negishi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/981,256

(22) Filed: Oct. 18, 2001

(65) Prior Publication Data
US 2002/0044430 A1 Apr. 18, 2002

(30) Foreign Application Priority Data

Oct. 18, 2000 (JP) ........................................ 2000-318330

(51) Int. Cl.$^7$ ................................................. A47F 5/00
(52) U.S. Cl. .................... 211/41.17; 361/796; 361/752; 312/265.4
(58) Field of Search ............................... 211/26, 41.17; 361/796, 803, 752, 784, 729, 730, 736; 312/265.1–265.6; 403/220, 291

(56) References Cited

U.S. PATENT DOCUMENTS 3,863,113 A * 1/1975 Ward ................... 211/41.17 X
4,713,714 A * 12/1987 Gatti et al.
5,253,147 A * 10/1993 Kleyner
5,460,348 A * 10/1995 Cox
5,657,649 A * 8/1997 Lim
6,115,259 A * 9/2000 Karner ................... 361/752 X
6,155,660 A * 12/2000 Nicolai ................ 312/265.1 X
6,202,860 B1 * 3/2001 Ludwig ............... 312/265.4 X

FOREIGN PATENT DOCUMENTS

JP           10-93264 A        4/1998

* cited by examiner

Primary Examiner—Robert W. Gibson, Jr.
(74) Attorney, Agent, or Firm—Sughrue Mion, PLLC

(57) ABSTRACT

A mechanism for reducing vibratory motion applied to a card cage mounted in a rack is disclosed. The cage accommodates a plurality of printed circuit boards arranged in parallel at regular intervals. The mechanism comprises dampers provided between the rack and the card cage. Each of the dampers is responsive to external vibrations applied to the rack in a transverse direction relative to a direction along which the plurality of printed circuit boards are arranged, and changes damping characteristics thereof in two stages depending on strengths and frequencies of the external vibrations.

6 Claims, 7 Drawing Sheets

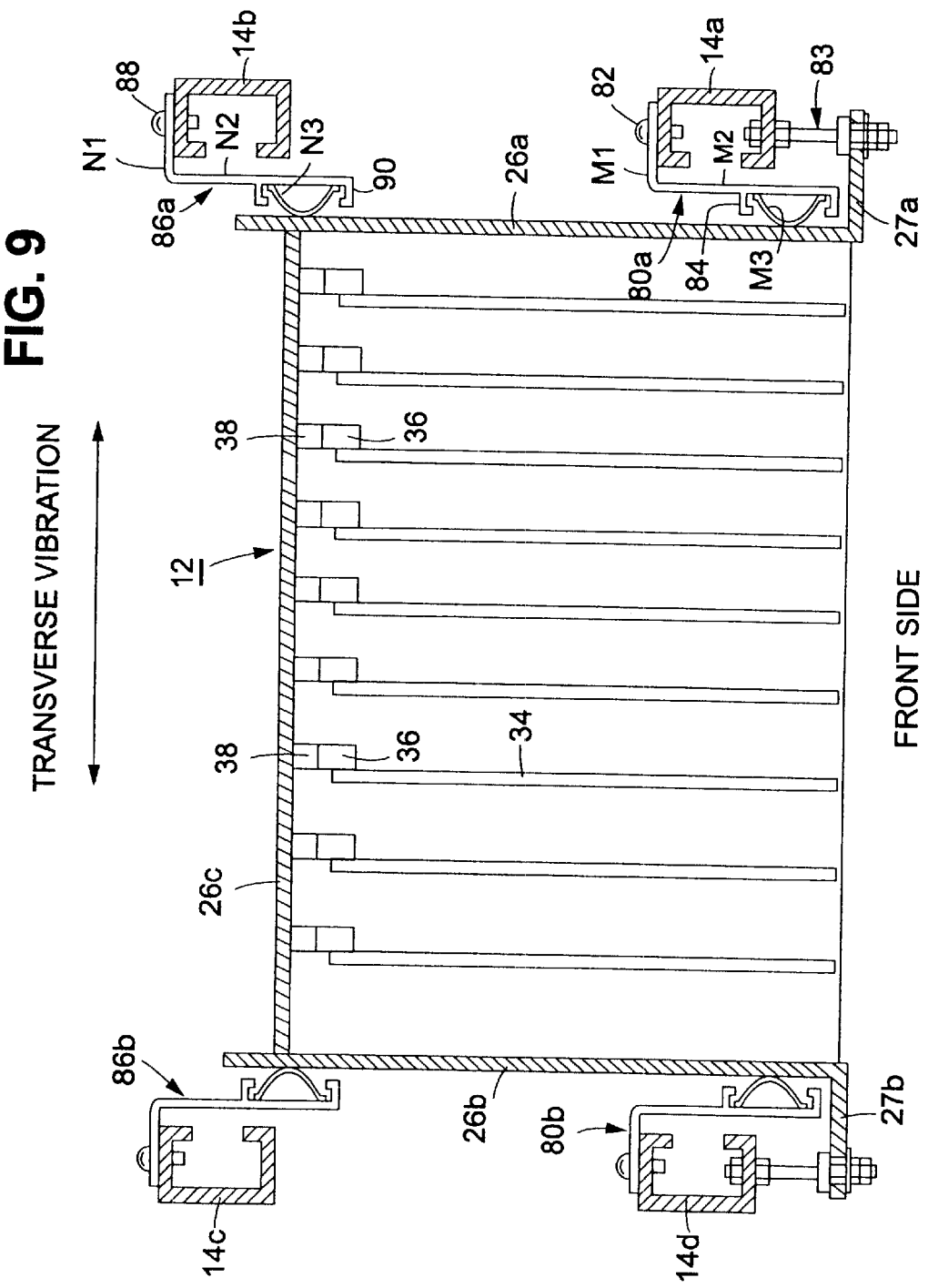

MECHANISM FOR REDUCING VIBRATORY MOTION APPLIED TO A RACK-MOUNTED CARD CAGE

BACKGROUND OF THE INVENTION

1. Field of the Invention

The present invention relates generally to a vibratory motion restrainer, and more specifically to a mechanism for reducing or depressing externally applied oscillations to a rack-mounted card cage by way of a rack, which cage accommodates a plurality of printed circuit boards.

2. Description of Related Art

As is known in the art, groups of printed circuit boards are interconnected by placing them in card cages (also known as shelves or sub-sacks) which include hardware for housing the printed circuit boards.

Prior to turning to the present invention, it is deemed preferable to briefly describe, with reference to FIGS. 1 and 2, a conventional rack and card cages, to which the present invention is applicable.

FIG. 1 is a perspective view schematically showing part of rack 10 and one card cage 12 to be housed therein. As shown, the rack 10 comprises four frames 14a–14d vertically provided at four corners of the rack 10, two side panels 16a and 16b secured to the frames 14a–14d, and a back panel 16c fixed to the frames 14b and 14c. The rack 10 further comprises a plurality of pairs of card cage ledges (shelves), each pair of which is used to support the card cage at left and right bottoms thereof. More specifically, FIG. 1 shows that the card cage 12 is supported by a pair of cage ledges (only one ledge 20a is partially shown). On the other hand, another pair of cage ledges 22a–22b are secured to the opposite inner sides of the rack 10 so as to support another card cage (not shown) to be installed into the rack 10 above the cage 12.

The card cage 12 comprises four frames 24 (one frame is hidden in FIG. 1) transversely positioned to tops and bottoms of front and rear portions thereof. The cage 12 further comprises two side panels 26a–26b respectively secured to the right and left sides of the cage 12, and a rear panel 26c fixed to the rear portion thereof. The side panels 26a–26b respectively have front edges 27a–27b which are respectively used to detachably fix the card cage 12 to the rack frames 14a–14b. Further, a plurality of guide rails 28 are mounted at the tops and bottoms of the four frames 24 at regular intervals between the side panels 26a–26b.

A plurality of card units 30 are detachably inserted into the corresponding guide rails 28, leaving a predetermined space. between the adjacent ones. The removing and extracting of the card units is for maintenance, upgrade or other purposes. Each card unit 30 is provided with a front panel 32, a printed circuit board 34, a unit connector 36 mating with a corresponding connector 38 (FIG. 2) provided on the inner wall of the rear panel 16c. Further, each unit 30 comprises a pair of ejectors 40 in the vicinity of top and bottom portions of the front panel 32. It is preferable to provide the ejector 40 with a suitable unit locking mechanism so as to prevent unintentional removal of the card unit 30 from the cage 12. It is to be noted that FIG. 1 omits a plurality of resilient supporting members provided between the rack 10 and the card cage 12, which will be referred to in FIG. 2.

FIG. 2 is a sectional plan view taken along a section line A—A of FIG. 1. In order to simplify the drawing, the front panel 32, the guide rails 28, etc. are omitted in that they are impertinent to the present invention.

As shown in FIG. 2. the cage 12, which has accommodated the multiple printed circuit boards 34, is housed in the rack 10 (FIG. 1), in the case of which each card unit connector 36 is electrically coupled to the corresponding cage connector 38. The card cage 12 is detachably secured to the rack frames 14a and 14d respectively at the elongated front edges 27a–27b using a suitable fastening member 50 such as a screw. On the other hand, resilient support members 52 are respectively fixed to the rack frames 14b and 14c using screws 54 at the rear portions thereof. The above-mentioned support members 52, however, may be welded to the corresponding rack frames 14b–14c in place of the screws 54. When the card cage 12 is completely inserted into the rack 10 as illustrated, the resilient support members 52 press the rear side portions of the cage 12, thereby rigidly supporting the same in the transverse direction, viz., a direction normal to that along which the printed circuit board 34 are inserted. The resiliently supporting technology, as just mentioned above, is disclosed in Japanese Laid-open Patent Application No. 10-93264. As an alternative, the resilient support members 52 may be fixed, using screws (for example), to the rear sides of the card cage. 12.

When the rack 10 is transported by land, sea, or air while accommodating the card units 30 (viz., printed circuit boards 34)within the cage(s) 12, the rack 10 is typically subject to vibrations or oscillations with a variety of frequencies and magnitudes. Further, even after the rack 10 has been set, the rack 10 may be subject to vibrations with low frequency and large amplitude due to earthquake (for example). Therefore, if the cage 12 is secured to the rack 10 using the rigid supporting members 52 at the rear portions, and fixed to the rack frames 14a–14d at the front edges 27a–27b, it is not expected to effectively reducing the externally applied vibrations with high frequencies and relatively low amplitude. On the other hand, if the supporting members 52 are made of material with high elasticity so as to high frequencies and low amplitude vibrations, it is in turn unable to effectively absorb the vibrations with low frequencies and large amplitudes.

If the vibrations applied to the card cage 12 coincides with the characteristic (natural) frequency of the printed circuit board, the electronic components may be damaged due to sympathetic vibrations. Further, in such a case, the adjacent card units may collide with each other, resulting in damages of the card units and/or the printed circuit boards mounted thereon.

SUMMARY OF THE INVENTION

It is therefore an object of the present invention to provide a mechanism for reducing vibratory motions applied to the rack-mounted card cage by changing a spring constant of a resilient member in response to the magnitude and frequencies of the vibration.

In brief, the object is achieved by the techniques wherein a mechanism for reducing vibratory motion applied to a card cage mounted in a rack is provided. The cage accommodates a plurality of printed circuit boards arranged in parallel at regular intervals. The mechanism comprises dampers provided between the rack and the card cage. Each of the dampers is responsive to external vibrations applied to the rack in a transverse direction relative to a direction along which the plurality of printed circuit boards are arranged, and changes damping characteristics thereof in two stages depending on strengths and frequencies of the external vibrations.

One aspect of the present invention resides in a mechanism for reducing vibratory motion applied to a card cage mounted in a rack, the card cage accommodating a plurality of printed circuit boards arranged in parallel at regular intervals, the mechanism comprising: damping means, provided between the rack and the card cage, for responding to external vibrations applied to the rack in a transverse direction relative to a direction along which the plurality of printed circuit boards are arranged, and changing damping characteristics thereof in two stages depending on strengths and frequencies of the external vibrations.

BRIEF DESCRIPTION OF THE DRAWINGS

The features and advantages of the present invention will become more clearly appreciated from the following description taken in conjunction with the accompanying drawings in which like elements or portions are denoted by like reference numerals and in which:

FIG. 9 is a horizontal sectional view of part of a rack and a card cage, together with vibration depressing members according to a third embodiment of the present invention.

DETAILED DESCRIPTION OF THE PREFERRED EMBODIMENTS

A principle underlying the present invention resides in the fact that a plurality of vibration depressing members are provided between a rack and a card cage in a manner to change spring constants thereof (viz., damping characteristics thereof) in two stages depending on the strength and amplitude of the vibrations transversely applied to the rack from external.

A first embodiment of the present invention will be described with reference to FIGS. 3 to 7.

Figure 1:
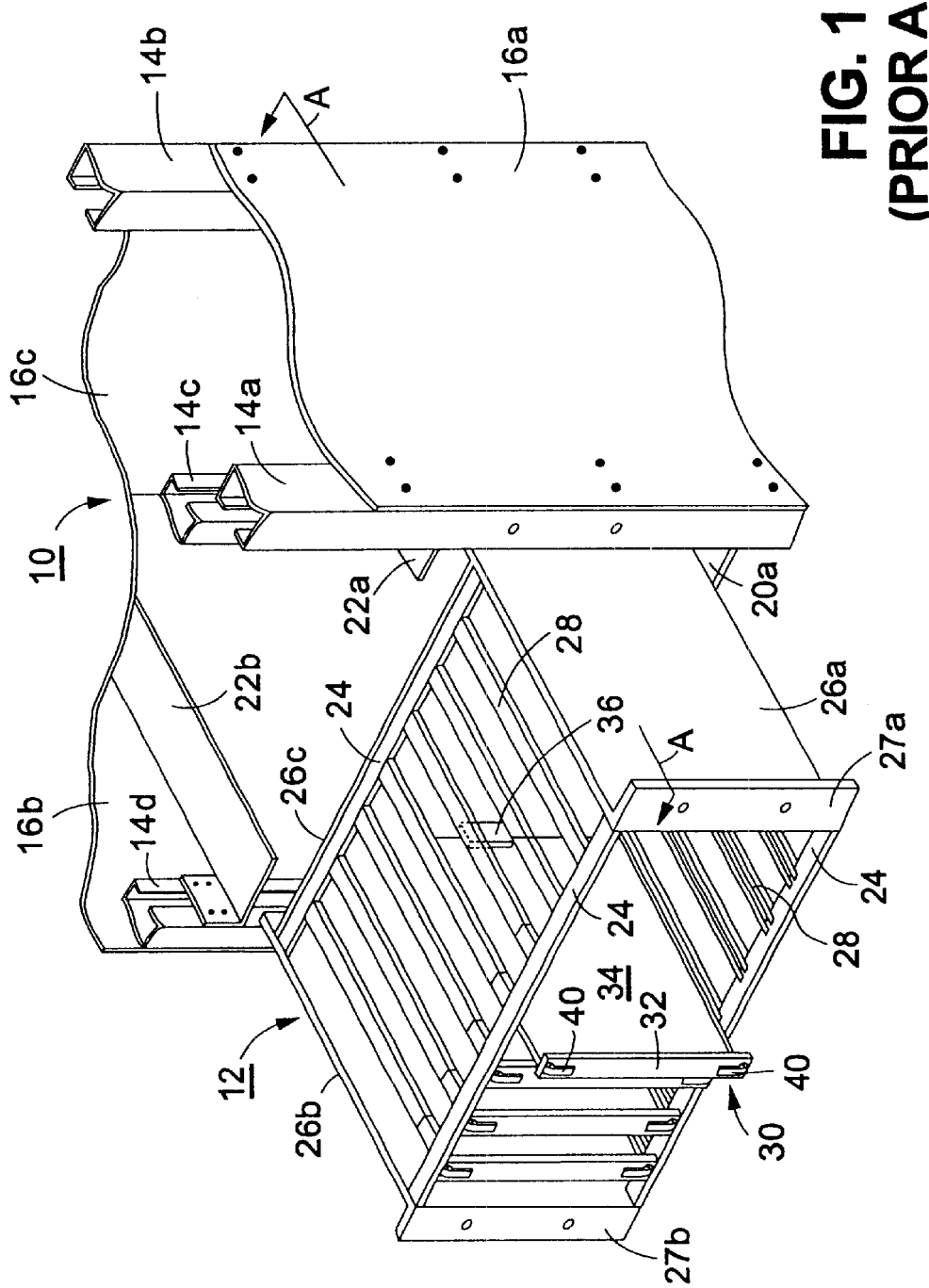
FIG. 1 is a perspective view showing part of a conventional rack and one card cage detachably inserted thereinto, having been referred to in the opening paragraphs of the instant disclosure.
Figure 2:
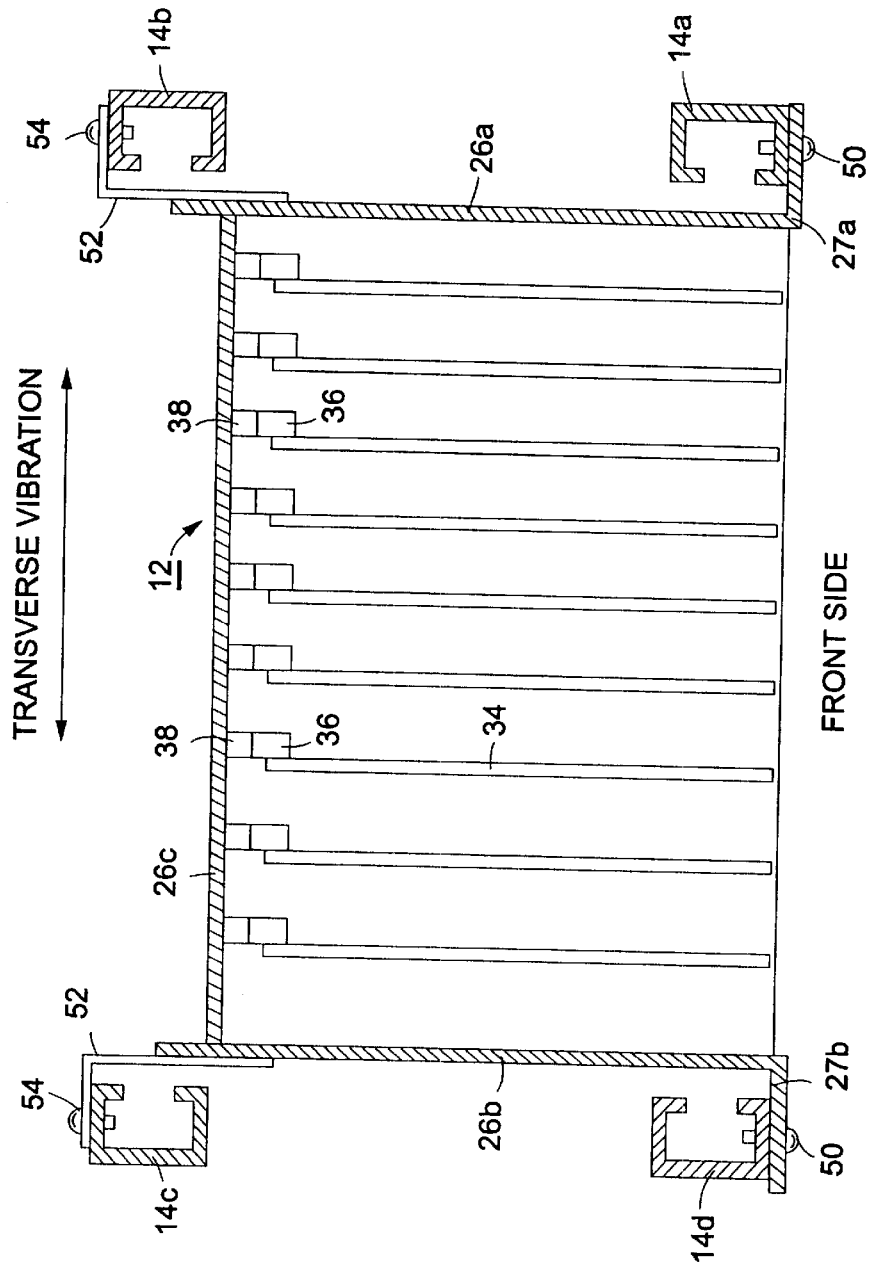
FIG. 2 is a horizontal sectional view of part of the rack and the card cage, taken along section line A—A of FIG. 1.
Figure 3:
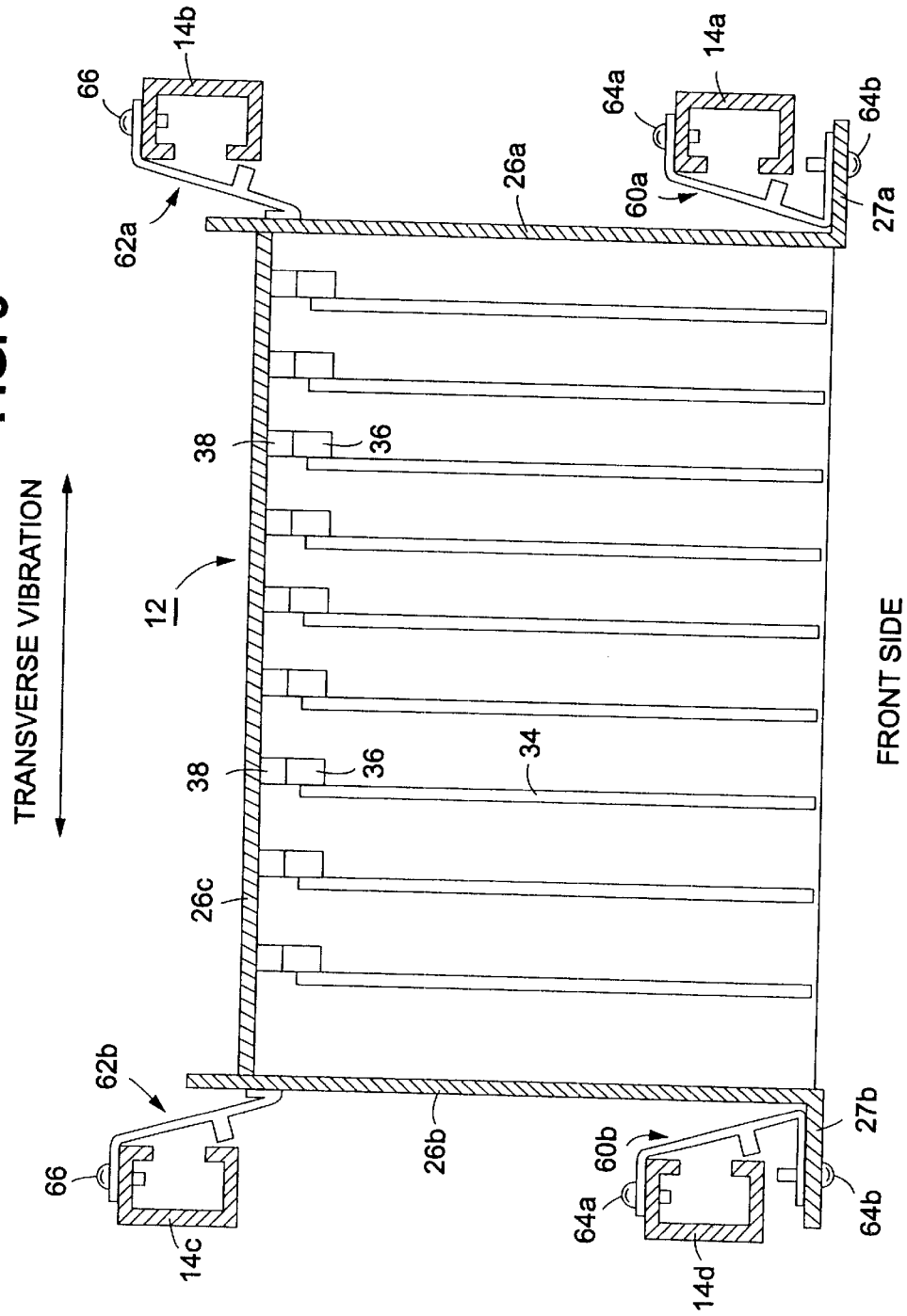
FIG. 3 is a horizontal sectional view of part of the rack and the card cage, together with vibration depressing members according to a first embodiment of the present invention.
Figure 4:
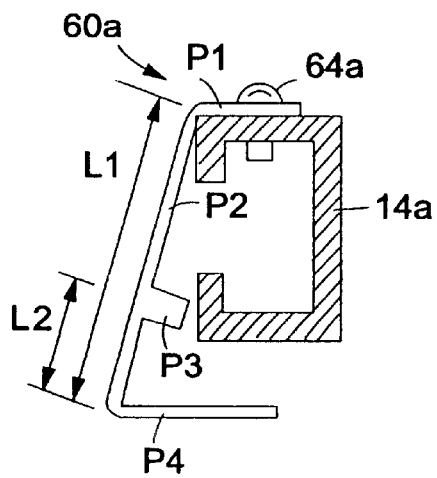
FIGS. 4(A) and 4(B) show respectively vibration depressing members shown in FIG. 3.
Figure 4:
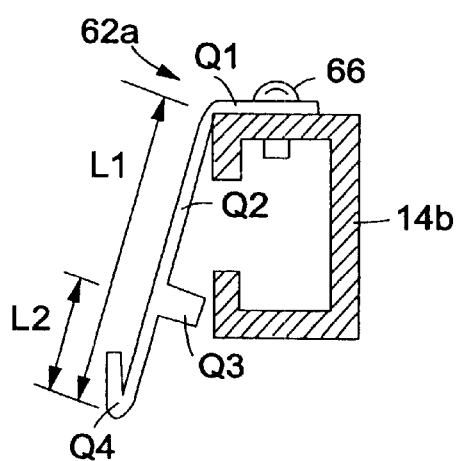

FIG. 3 is a sectional view, which corresponds to FIG. 1, schematically showing vibration depressing members 60a–60b and 62a–62b according to the first embodiment and the portions or members associated therewith. In FIG. 3, the portions other than the members 60a–60b and 62–62b are substantially identical to those shown in FIG. 2, and accordingly, the descriptions thereof will be not given except for becoming necessary in context.

As shown in FIG. 3, the vibration depressing member 60a is provided between the rack frame 14a and the right front portion of the cage 12, while the other vibration depressing member 60b is positioned between the rack frame 14b and the left front portion of the case 12. Similarly, the vibration depressing member 62a is provided between the rack frame 14b and the right rear portion of the cage 12, and the other vibration depressing member 62b is provided between the rack frame 14c and the left rear portion of the case 12.

Each of the members 60a–60b and 62a–62b is a plate member. Since the members 60a–60b are configured in exactly the same manner, it is sufficient to refer only to the member 60a, and similarly, since members 62a–62b are formed in exactly the same manner, the description is made only to the member 62a. The vibration depressing members 60a and 62b will be discussed in detail with reference to FIGS. 4(A) and 4(B).

As shown in FIG. 3, the rear portion of the member 60a is secured to the rack frame 14a by way of a screw 64a, and the front portion thereof is detachably fixed to the elongated front edge 27a using a screw 64b corresponding to the screw 50 of FIG. 2. On the other hand, the member 62a is secured, at the rear portion thereof, to the rack frame 140 by way of a screw 66. It is to be noted that the rear portions of the members 60a and 62b may be welded in place of the aforesaid fixing using the screws.

FIGS. 4(A) and 4(B) are respectively top views of the vibration depressing members 60a and 62a (FIG. 3) and sectional views of rack frames 14a and 14b. As shown in FIG. 4(A), the vibration depressing member 60a is provided with a rear portion P1 rigidly attached to the rear side of the frame 14a using the screw 64a, an intermediate portion P2 extending from the rear portion P1 toward the front side of the rack 10 (i.e., the cage 12) at an angle with respect to the cage inserting direction, a protrusion P3 outwardly projecting from the inner side of the intermediate portion P2, and a front portion P4 detachably fixed to the front end plate 27a by means of the screw 64b (FIG. 3). On the other hand, as shown in FIG. 4(B), the vibration depressing member 62a, provided at the rear portion of the rack 10, has a rear portion Q1 rigidly attached to the rear side of the frame 14b using the screw 66, an intermediate portion Q2 extending from the rear portion Q1 toward the front side of the rack 10 (i.e. the cage 12) at an angle with respect to the cage inserting direction, a protrusion Q3 outwardly projecting from the inner side of the intermediate portion Q2, and a front portion Q4 with a folded portion abutting the rear side of the cage 12. Each of the intermediate portions P2 and Q2 functions as a plate spring as will be described later. The legends L1, L2, and L3 attached to FIGS. 4(A) and 4(B) will be described with reference to FIG. 5.

Figure 5:
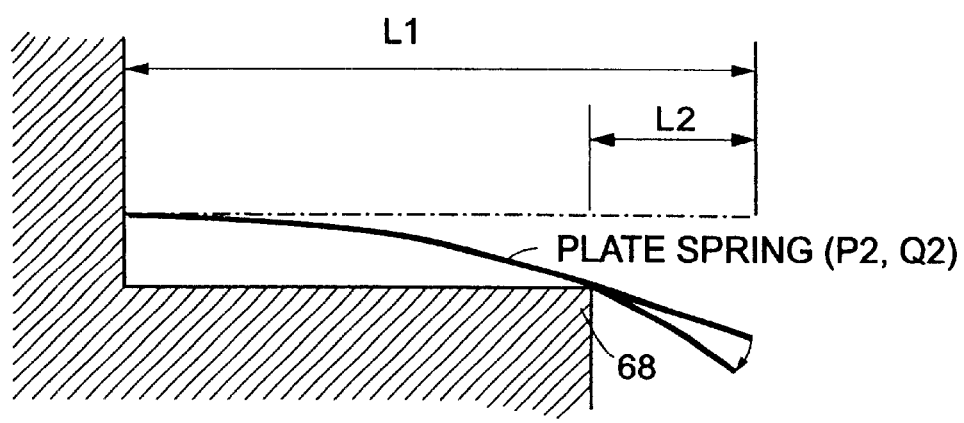
FIG. 5 is a sketch graphically showing the manner wherein a spring constant of the vibration depressing member of FIG. 3 is changed.
Figure 6:
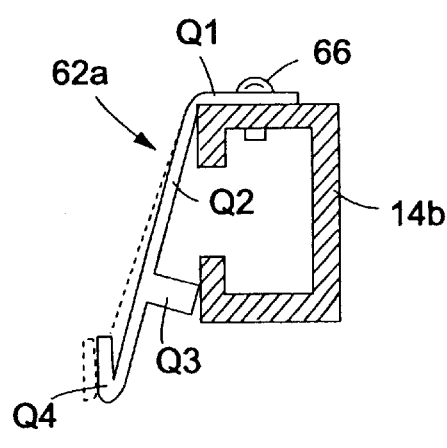
FIGS. 6(A) and (B) are diagrams respectively showing different operations of the vibration depressing member of FIG. 3.
Figure 6:
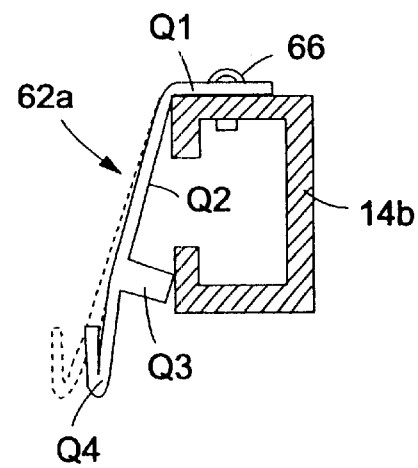

FIG. 5 is a diagram graphically showing the operation of the intermediate portion P2 or Q2 of FIG. 3. In FIG. 5, L1 denotes an effective elastic length of the intermediate portion P2 when the protrusion P3 does not reach the frame 14a (14b)(referred to as CASE 1) or touches the frame 14a without applying any pressure thereto, and L2 is an effective elastic length when the protrusion P3 presses the frame 14a (14b) (referred to as CASE 2) or vice versa. CASE 1 and CASE 2 respectively occur when the rack 10 is subject to the external vibrations less than and exceeding a threshold condition determined by magnitude and amplitude of the vibration, elasticity of the vibration depressing members, size and weight of the rack and the card cage, etc. In the instant disclosure, the threshold condition is used to determine whether or not the spring constant of the vibration depressing member is switched over. In the above description, the intermediate portion P2 (or Q2). which operates as a plate spring, can be regarded as a beam with one end fixed and the other end being free. In this case, when the plate spring is not forced onto a fixed corner 68, a spring constant K1 of the plate spring is determined by the following equation.

$$K1=3EI/L1^3$$

where E denotes a modulus of longitudinal elasticity, and I denotes geometrical moment of inertia (i.e., second moment of area). On the other hand, when the plate spring is forced onto the fixed corner 68, a spring constant K2 of the plate spring is determined as follows.

$$K2=3EI/L2^3$$

Since L2<L1, then K1<K2. This implies that the vibration depressing member 60a (or 62a) responds to the vibratory motion externally applied to the rack 10 (FIG. 1) and changes the spring constant thereon in two stages, thereby to effectively reduce the vibrating forces imparted onto the rack-mounted card cage 12.

FIGS. 6(A) and 6(B) show respectively the above-mentioned CASE 1 and CASE 2 with respect to the vibration depressing member 62a. As shown in FIG. 6(A). when the rack 10 (FIG. 1) is subject to the external vibrations less than the threshold condition, the protrusion Q3 is kept apart from the rack frame 14b. Thus, in such a case, the member 62a absorbs the vibratory motion using the full length of the intermediate portion Q2. Contrarily, as illustrated in FIG. 6(B), when the rack 10 (FIG. 1) is subject to the external vibrations exceeding the threshold condition, the protrusion Q3 abuts or strongly presses the rack frame 14 or vice versa, and the vibratory motion is absorbed using part of the intermediate portion Q2. The above discussion is applicable to the other member 60a.

Figure 7:
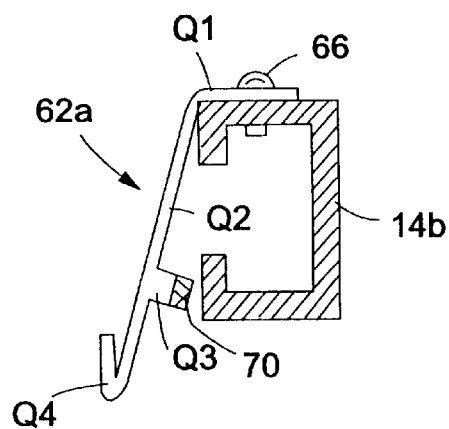
FIG. 7 is a diagram schematically showing a variation of the first embodiment.

Reference is made to FIG. 7, a variation of the first embodiment is illustrated. That is, the vibration depressing member 62a is provided with a suitable buffer member (tip) 70, made of rubber for example, at the end of the projection Q3. Other than this, the. member 62 is formed in exactly the same manner as mentioned above. Such a buffer member 70 is also attached to the end of the protrusion P3 of the other member 60a (FIG. 3).

Figure 8:
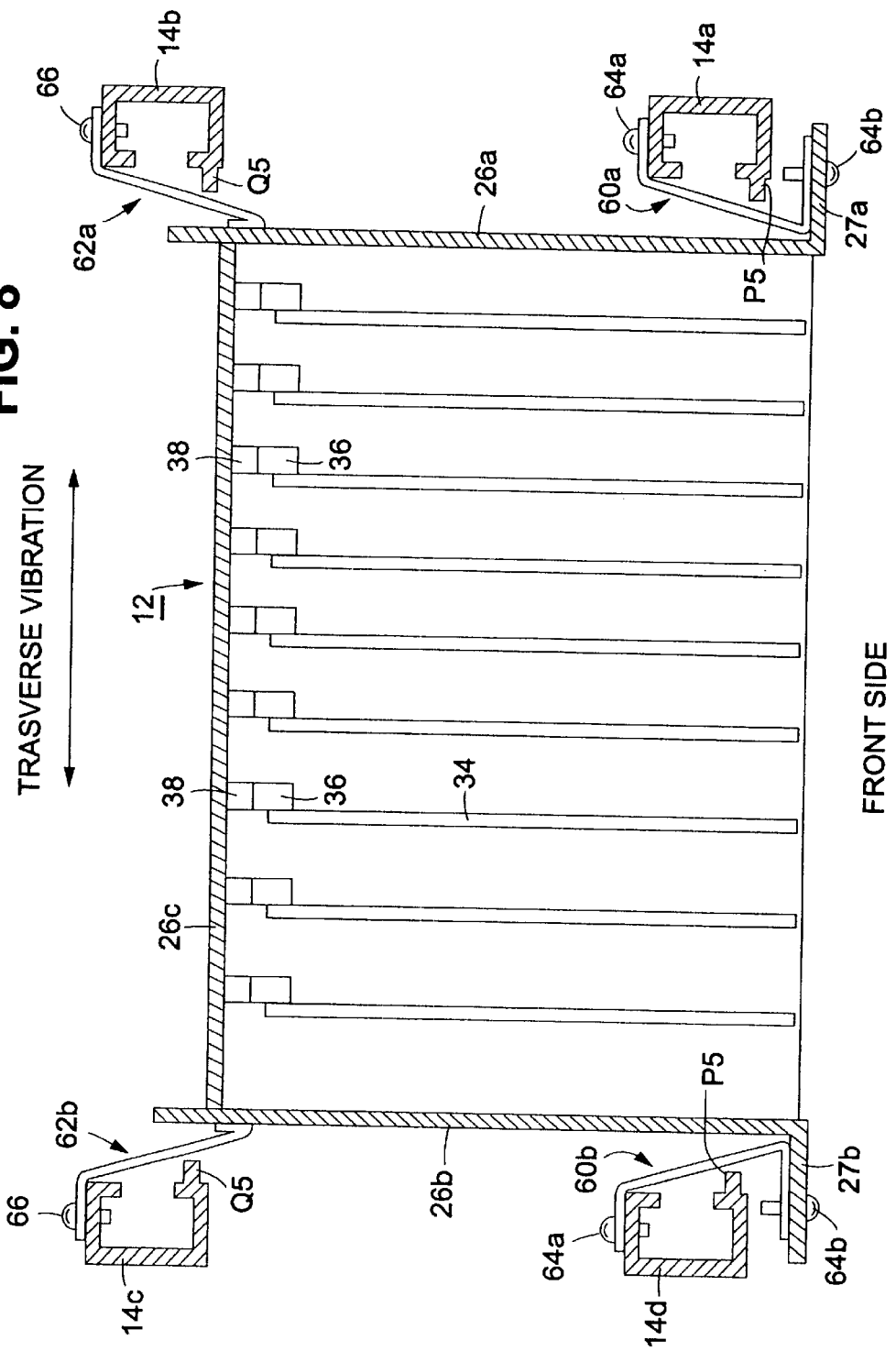
FIG. 8 is a horizontal sectional view of part of a rack and a card cage, together with vibration depressing members according to a second embodiment of the present invention.

A second embodiment of the present invention will be described with reference to FIG. 8. According to the instant embodiment, a protrusion for use in changing the above-mentioned spring constant is provided at the corresponding rack frame in place of the vibration depressing member. That is, the protrusions P5 are respectively provided at the rack frames 14a and 14d, while the protrusions Q5 are respectively provided at the rack frames 14b and 14c. Other than this, the second embodiment Is identical to the first embodiment, and as such, further description thereof will be omitted for the sake of simplifying the disclosure. It is clearly understood that the operation of reducing the externally applied vibrations according to the second embodiment is substantially identical to that of the first embodiment A third embodiment of the present invention will be described with reference to FIG. 9. As shown, a vibration depressing member 80a, provided at the lower right hand corner in the figure, comprises a rear portion M1 secured to the frame 14a using a screw 82, an elastic portion M2 extending substantially in parallel with the side wall of the card cage 12. and a semi-cylindrical resilient member M3 accommodated in a holder 84. The card cage 12 is detachably secured, at the front edge 27a, to one end of a rod-like member 83 whose other end is fixed to the frame 14a. Likewise, another vibration depressing members 86a, provided at the upper right hand corner In the figure, comprises a rear portion N1 secured to the frame 14b using a screw 88, an elastic portion N2 extending substantially in parallel with the side wall of the card cage 12, and a semi-cylindrical resilient member N3 accommodated in a holder 90. A vibration depressing member 80b, provided between the rack frame 14d and the left front side of the cage 12 is formed in exactly the same manner as the member 80a although the member 80b is installed in a reversed manner relative to the member 80a. Further, a vibration depressing member 86b, provided between the rack frame 14c and the left rear side of the cage 12, is formed in exactly the same manner as the member 86a, which is however installed in a reversed manner relative to the member 86a.

Since the vibration reducing functions of the members 80a–80b and 86a–86b are substantially identical with one another, the operation of the member 80a is described on behalf of the remainders. When the vibratory motions applied to the rack 10 (FIG. 1) is less than the above-mentioned threshold condition, the vibratory motions are absorbed by the semi-cylindrical member M3. On the other hand, if the vibratory motions applied to the rack 10 exceeds the threshold condition, the semi-cylindrical member M3 is pressed to an extent that the holder 84 abuts the side wall of the card cage 12 or vice versa, whereby the vibratory motions are absorbed by the resilient portion M2.

The foregoing descriptions show one preferred embodiment and some modifications thereof. However, other various modifications are apparent to those skilled in the art without departing from the scope of the present invention which is only limited by the appended claims. Therefore, the embodiments and modification shown and described are only illustrated, not restrictive.

What is claimed is:

1. A mechanism for reducing vibratory motion applied to a card cage mounted in a rack, said card cage accommodating a plurality of printed circuit boards arranged in parallel at regular intervals, said mechanism comprising:

damping means, provided between said rack and said card cage, for responding to external vibrations applied to said rack in a transverse direction relative to a direction along which said plurality of printed circuit boards are arranged, and changing damping characteristics thereof in two stages depending on strengths and frequencies of said external vibrations.

2. The mechanism as claimed in claim 1, wherein said card cage is substantially a hexahedron, and said damping means comprises four spring members respectively provided between said rack and said card cage at around four inner corners of said rack.

3. The mechanism as claimed in claim 2, wherein each of spring members is a plate spring whose effective deflection length varies in two stages depending on the strengths and frequencies of said external vibrations.

4. The mechanism as claimed in claim 3, wherein two of said four spring members are respectively positioned at the front sides of said rack, each of said two of said four spring member being provided with rear and front portions and an elastic portion extending between said rear and front portions, said rear portion fixed to a rack frame and said front portion detachably secured to a front portion of said card cage, said elastic portion having a projection outwardly projecting towards the corresponding rack frame while leaving a predetermined space between said projection and said rack frame, and wherein each of the remaining spring members, positioned at the rear side of said rack, is provided with rear and front portions and an elastic portion extending between said rear and front portions, said rear portion fixed to a rack frame and said front portion abutting in a manner of pressurizing the corresponding portion of said card cage, said elastic portion having a projection outwardly projecting towards the corresponding rack frame while leaving a predetermined space between said projection and said rack frame.

5. The vibration damping mechanism as claimed in claim 4, wherein each of said first and second damping members is provided with a shock absorber attached to the end thereof.

6. The mechanism as claimed in claim 3, wherein each of said four spring members is provided with a rear portion and an elastic portion extending substantially in parallel with the direction along which said plurality of printed circuit boards are arranged, said rear portion fixed to a rack frame and said elastic portion having a spring holder wherein a semi-cylindrical plate spring is housed, said semi-cylindrical plate spring normally protruding in a manner of abutting the side wall of said card cage while spacing apart said elastic portion from the side wall of said card cage.

* * * * *